United States Patent
Sathyanarayan et al.

(10) Patent No.: US 9,952,784 B2
(45) Date of Patent: Apr. 24, 2018

(54) MULTICHIP DUAL WRITE

(71) Applicant: SANDISK TECHNOLOGIES LLC, Plano, TX (US)

(72) Inventors: Rohit Hassan Sathyanarayan, Bangalore (IN); Vinay Sandeep, Bangalore (IN)

(73) Assignee: SANDISK TECHNOLOGIES LLC, Plano, TX (US)

( * ) Notice: Subject to any disclaimer, the term of this patent is extended or adjusted under 35 U.S.C. 154(b) by 68 days.

(21) Appl. No.: 14/645,102

(22) Filed: Mar. 11, 2015

(65) Prior Publication Data
US 2016/0266821 A1 Sep. 15, 2016

(51) Int. Cl.
| | |
|---|---|
| *G06F 3/06* | (2006.01) |
| *G06F 11/16* | (2006.01) |
| *G06F 12/06* | (2006.01) |
| *G11C 8/12* | (2006.01) |
| *G11C 16/10* | (2006.01) |
| *G11C 29/00* | (2006.01) |
| *G06F 11/20* | (2006.01) |
| *G11C 7/10* | (2006.01) |

(52) U.S. Cl.
CPC .......... *G06F 3/0619* (2013.01); *G06F 3/0613* (2013.01); *G06F 3/0659* (2013.01); *G06F 3/0685* (2013.01); *G06F 3/0688* (2013.01); *G06F 11/167* (2013.01); *G06F 11/1666* (2013.01); *G06F 12/0638* (2013.01); *G11C 8/12* (2013.01); *G11C 16/10* (2013.01); *G11C 29/74* (2013.01); *G11C 29/765* (2013.01); *G06F 11/20* (2013.01); *G06F 2212/7208* (2013.01); *G11C 7/1045* (2013.01)

(58) Field of Classification Search
CPC .... G06F 3/0659; G06F 3/0613; G06F 3/0619; G06F 3/0688; G06F 3/0683
See application file for complete search history.

(56) References Cited

U.S. PATENT DOCUMENTS

| | | | | |
|---|---|---|---|---|
| 5,603,001 | A * | 2/1997 | Sukegawa | G06F 3/0601 711/103 |
| 7,577,806 | B2 * | 8/2009 | Rowan | G06F 11/1471 711/114 |
| 8,554,963 | B1 | 10/2013 | Shapiro et al. | |
| 2004/0015674 | A1 * | 1/2004 | Lakhani | G06F 12/0246 711/206 |
| 2006/0198202 | A1 | 9/2006 | Erez | |
| 2009/0083485 | A1 | 3/2009 | Cheng | |

(Continued)

OTHER PUBLICATIONS

International Search Report and Written Opinion in International Patent Application No. PCT/US2015/060936, dated Feb. 3, 2016.

*Primary Examiner* — Larry T Mackall
(74) *Attorney, Agent, or Firm* — Foley & Lardner LLP

(57) ABSTRACT

Identical data is written to multiple nonvolatile memory chips connected to a memory bus by sending address information to a first nonvolatile memory chip and a second nonvolatile memory chip, selecting the first and second nonvolatile memory chips, while the first nonvolatile and second nonvolatile memory chips are both selected, sending user data over the memory bus to the first and second nonvolatile memory chips in parallel, and programming the user data in the first nonvolatile memory chip and the second nonvolatile memory chip in parallel.

19 Claims, 15 Drawing Sheets

(56) References Cited

U.S. PATENT DOCUMENTS

| | | |
|---|---|---|
| 2009/0094406 A1* | 4/2009 | Ashwood .............. G06F 13/404 |
| | | 711/103 |
| 2013/0013981 A1 | 1/2013 | Manning |
| 2013/0080683 A1 | 3/2013 | Sukegawa |
| 2013/0138871 A1* | 5/2013 | Chiu ................... G06F 12/0246 |
| | | 711/103 |
| 2014/0032697 A1 | 1/2014 | Shapiro et al. |
| 2014/0143479 A1 | 5/2014 | Manning |

* cited by examiner

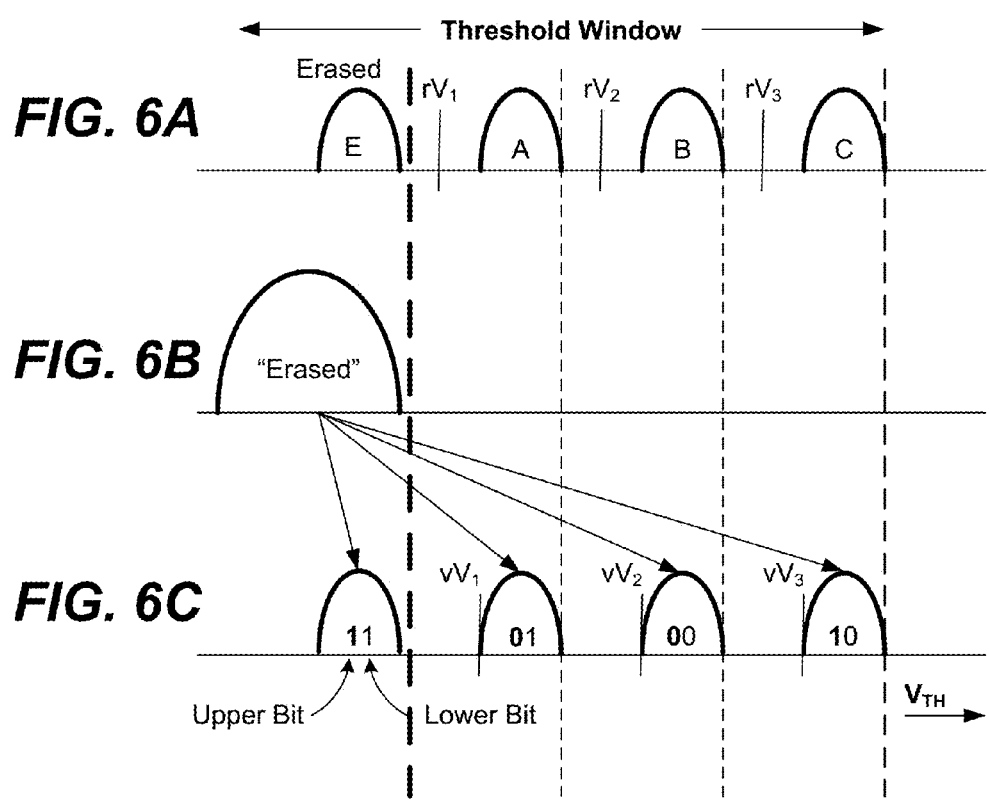

MULTICHIP DUAL WRITE

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

In some cases, two or more memory dies are connected to a common bus, for example, a memory bus that sends data to and from a memory controller. A memory controller may manage one such memory bus, or may manage two or more memory busses, and each memory bus may have two or more memory dies. Thus, large memory systems may be built from multiple dies that are operated together.

SUMMARY

In some nonvolatile memory systems, data to be stored may be written in parallel to two different dies that are connected to a common bus. Identical data may be written in each die and if a program failure occurs in one die then the failure may be ignored and only the successfully written copy is used. If no program failure occurs then some decision may be made as to which copy is preferable. The preferred copy is then maintained and the other copy may be discarded. Data may be transferred in parallel and then programmed in parallel by enabling both chips at the same time. Address information may also be transferred in parallel by enabling both dies and transferring address information. If different physical addresses are used in different dies then address information may be transferred sequentially by enabling one die at a time and transferring die-specific address information to each die.

An example of a method of writing identical data to multiple nonvolatile memory chips connected to a memory bus includes: sending address information to a first nonvolatile memory chip and a second nonvolatile memory chip; selecting the first nonvolatile memory chip; selecting the second nonvolatile memory chip; while the first nonvolatile memory chip and the second nonvolatile memory chip are both selected, sending user data over the memory bus to the first nonvolatile memory chip and sending the user data over the memory bus to the second nonvolatile memory chip in parallel; and programming the user data in the first nonvolatile memory chip and the second nonvolatile memory chip in parallel.

Sending the address information to the first nonvolatile memory chip and the second nonvolatile memory chip may include: selecting the first nonvolatile memory chip; sending first address information to the first nonvolatile memory chip over the memory bus; subsequently selecting the second nonvolatile memory chip; and sending second address information to the second nonvolatile memory chip over the memory bus, the second address information being different to the first address information. The first address information may be limited to good blocks in the first nonvolatile memory chip, the second address information may be limited to good blocks in the second nonvolatile memory chip, the good blocks in the first nonvolatile memory chip and the good blocks in the second nonvolatile memory chip being at different physical locations in respective blocks. Sending the address information to the first nonvolatile memory chip and the second nonvolatile memory chip may include: selecting the first nonvolatile memory chip and the second nonvolatile memory chip at the same time; and sending the address information to the first nonvolatile memory chip and the second nonvolatile memory chip over the memory bus, the address information including one or more addresses, each of the one or more addresses corresponding to a physical location in the first nonvolatile memory chip and a corresponding physical location in the second nonvolatile memory chip. The user data may be programmed in the first chip and the second chip at corresponding physical locations. The status of programming in the first nonvolatile memory chip and the second nonvolatile memory chip may subsequently be determined. If the status of programming in the first nonvolatile memory chip is a failed status, then a copy of the user data in the first nonvolatile memory chip may be marked as bad and subsequently read requests for the user data may be directed to the copy of the user data in the second nonvolatile memory chip. All user data stored in the first nonvolatile memory chip may also be stored in the second nonvolatile memory chip. Subsequent to programming the user data in the first nonvolatile memory chip and the second nonvolatile memory chip in parallel, a copy of the user data in either the first or second nonvolatile memory chip may be identified as an obsolete copy and subsequently the obsolete copy may be erased while a valid copy in the other of the first and second nonvolatile memory chips is maintained. The obsolete copy may be identified according to at least one of: write time, write loop count, and/or write errors when programming the user data in the first nonvolatile memory chip and the second nonvolatile memory chip in parallel.

An example of a multi-chip nonvolatile memory system includes: a first nonvolatile memory chip; a second nonvolatile memory chip; a data bus that transfers data to and from the first nonvolatile memory chip and the second nonvolatile memory chip; an address bus that transfers address information to the first nonvolatile memory chip and the second nonvolatile memory chip; and a memory controller configured to, in a dual write mode, select the first nonvolatile memory chip and the second nonvolatile memory chip at the same time and send user data over the data bus to be stored in the first nonvolatile memory chip and the second nonvolatile memory chip in parallel.

A first chip select line may extend from the memory controller to the first nonvolatile memory chip and a second chip select line may extend from the memory controller to the second nonvolatile memory chip, the memory controller configured to, in the dual write mode, send first address information on the address bus while applying a select signal on the first chip select line, and subsequently send second address information on the address bus while applying a select signal on the second chip select line, the first address information being different to the second address information. The first nonvolatile memory chip may contain first bad blocks, the second nonvolatile memory chip may contain second bad blocks, the memory controller may maintain maps of first bad blocks and second bad blocks, and the first address information may be directed only to blocks of the first nonvolatile memory chip that are not on the map of first bad blocks and the second address information may be directed only to blocks of the second nonvolatile memory chip that are not on the map of second bad blocks. A first chip select line may extend from the memory controller to the first nonvolatile memory chip and a second chip select line may extend from the memory controller to the second nonvolatile memory chip, the memory controller configured to, in the dual write mode, apply a select signal on the first chip select line and on the second chip select line in parallel, and while the select signal is applied on the first chip select line and on the second chip select line, send address information on the data bus. The memory controller may be configured to, in the dual write mode, while the select signal is applied on the first chip select line and on the second chip select line, send address information to the first nonvolatile memory chip and to the second nonvolatile memory chip in parallel. The memory controller may be configured to, in the dual write mode, perform a status check on the first nonvolatile memory chip and the second nonvolatile memory chip after sending the user data over the data bus. The memory controller may be further configured to maintain a record of programming failures and to direct any subsequent read requests to a copy of written data that did not produce a programming failure. The memory controller may be configured to, in a single-die write mode, select one and only one die at any time.

An example of a method of writing identical data to multiple memory chips connected to a memory bus includes: sending address information to a first nonvolatile memory chip and a second nonvolatile memory chip over an address bus; selecting the first nonvolatile memory chip and the second nonvolatile memory chip; while the first nonvolatile memory chip and the second nonvolatile memory chip are both selected, sending user data over a data bus to the first nonvolatile memory chip and sending the user data over the data bus to the second nonvolatile memory chip in parallel; programming the user data in the first nonvolatile memory chip and the second nonvolatile memory chip in parallel; subsequently determining whether to read the user data from the first nonvolatile memory chip or the second nonvolatile memory chip based on at least one of: a programming error detected, a read error detected, a high error rate.

The memory chips may be configured for storage of identical data in response to a determination that the memory chips have high rates of: program failure, or read failure.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

DETAILED DESCRIPTION

Memory System

Figure 1:
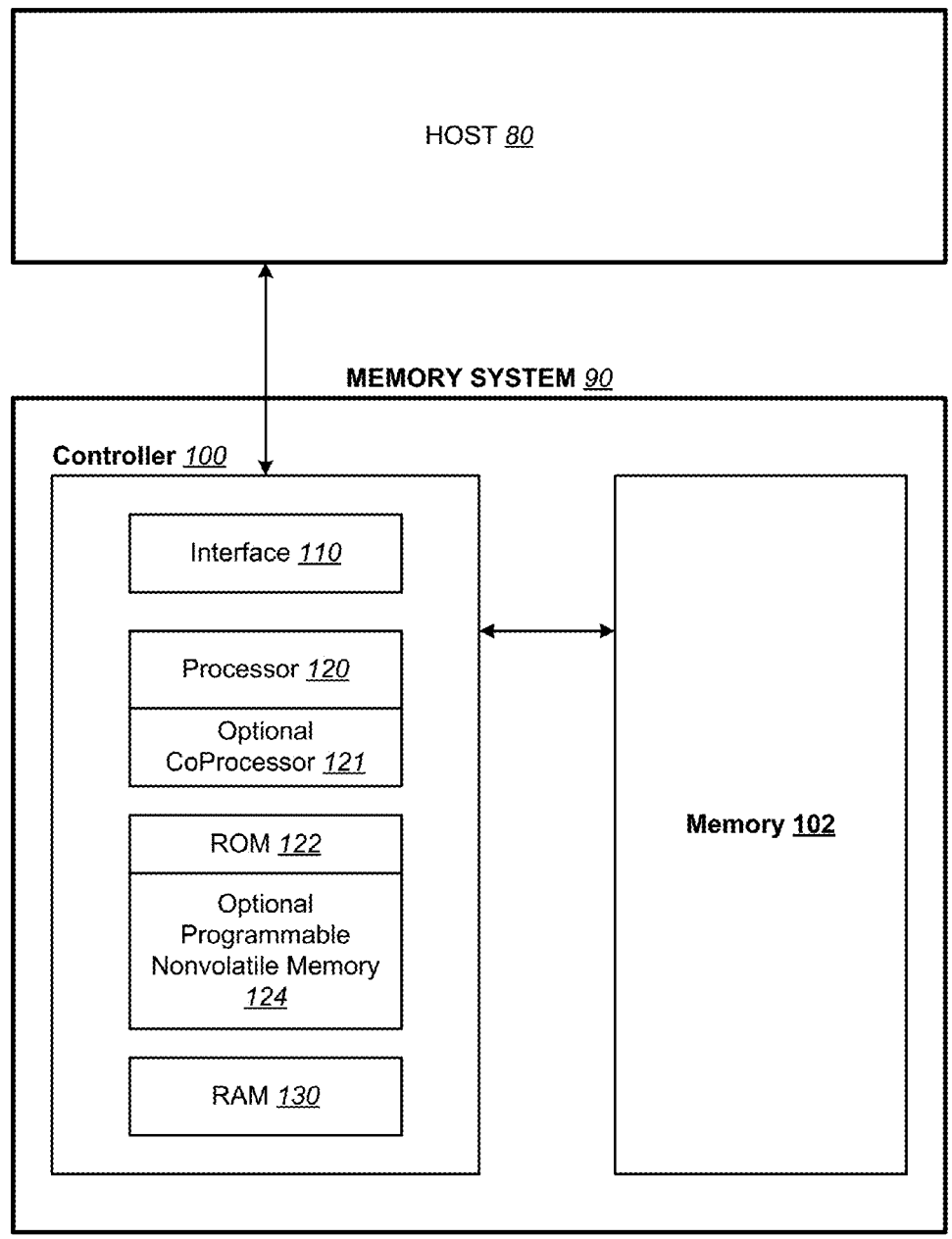
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
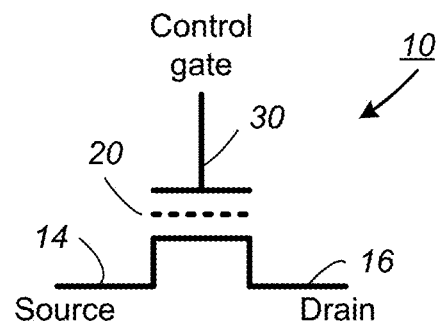
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
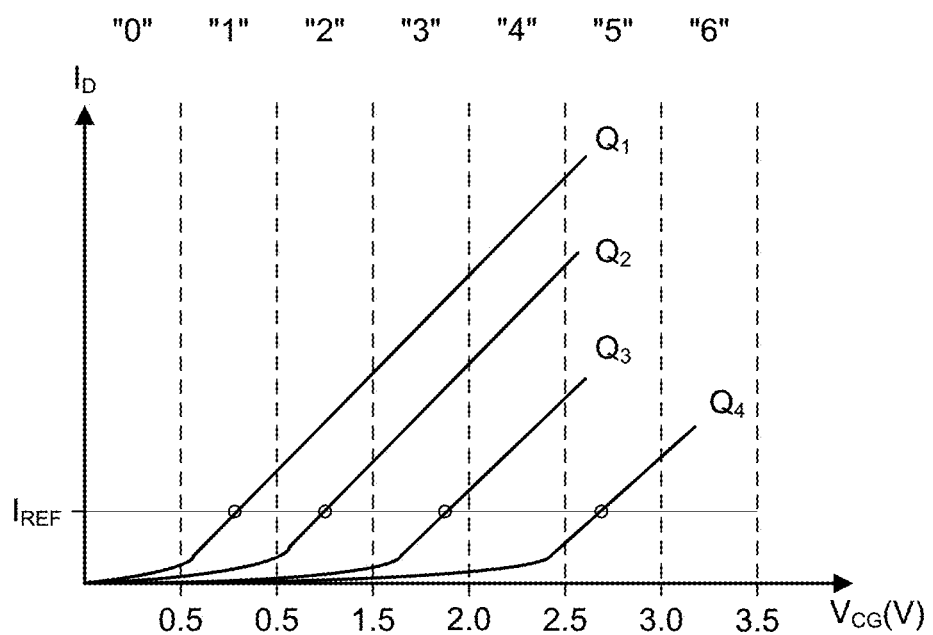
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
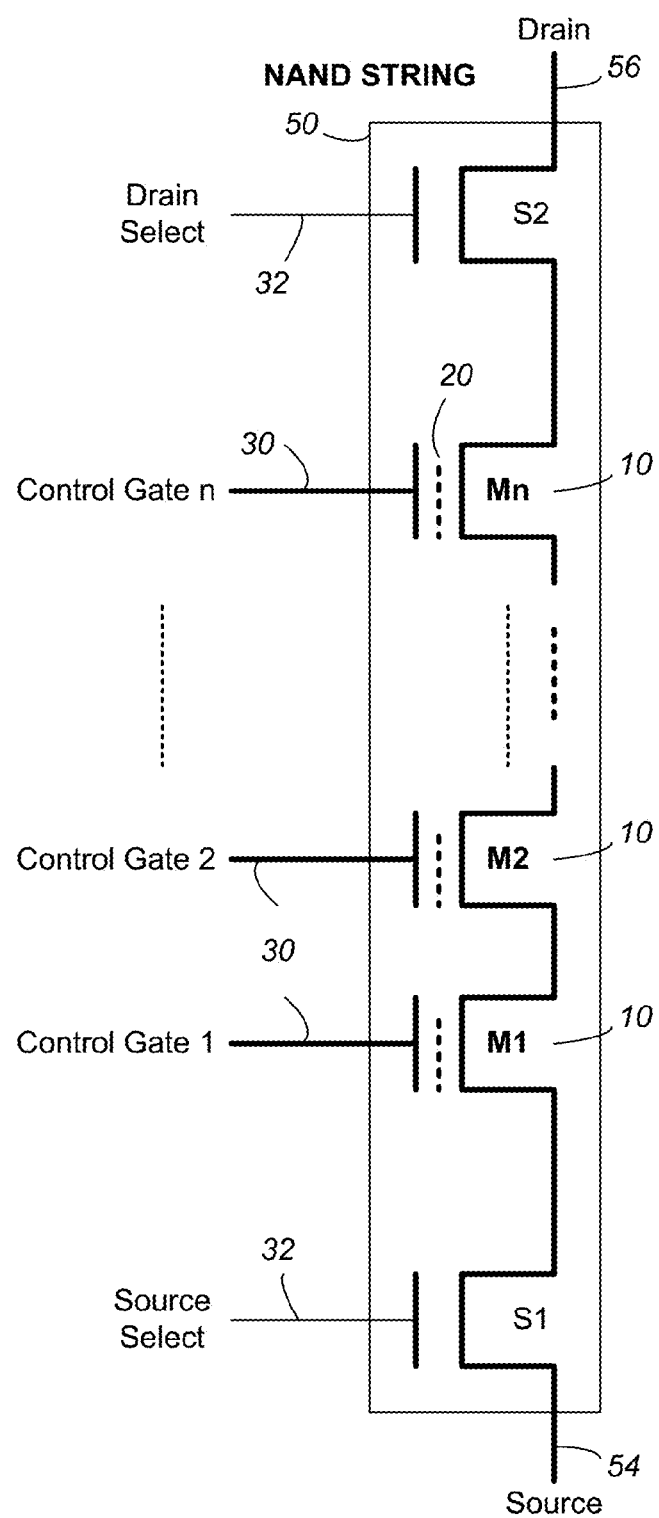
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
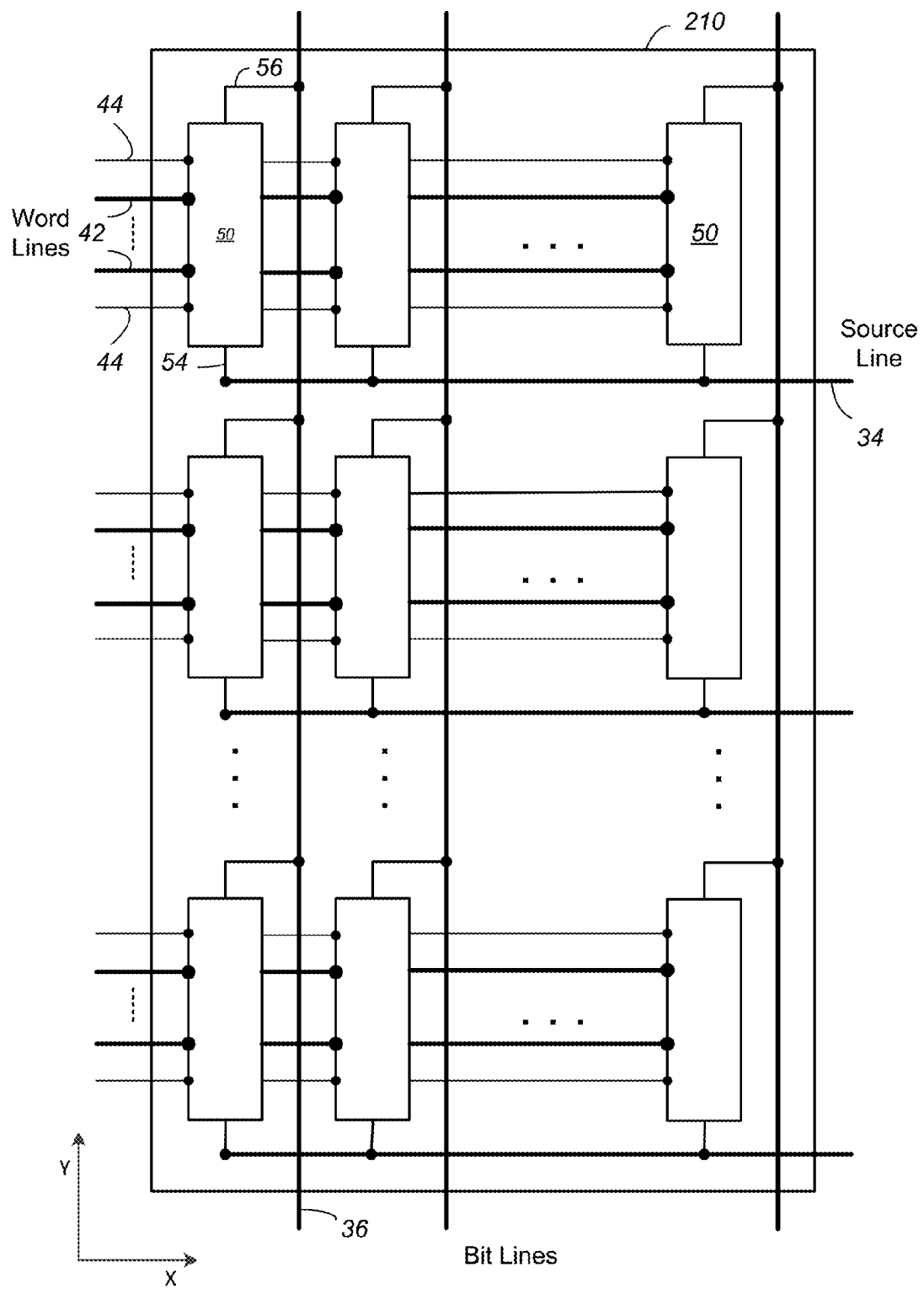
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
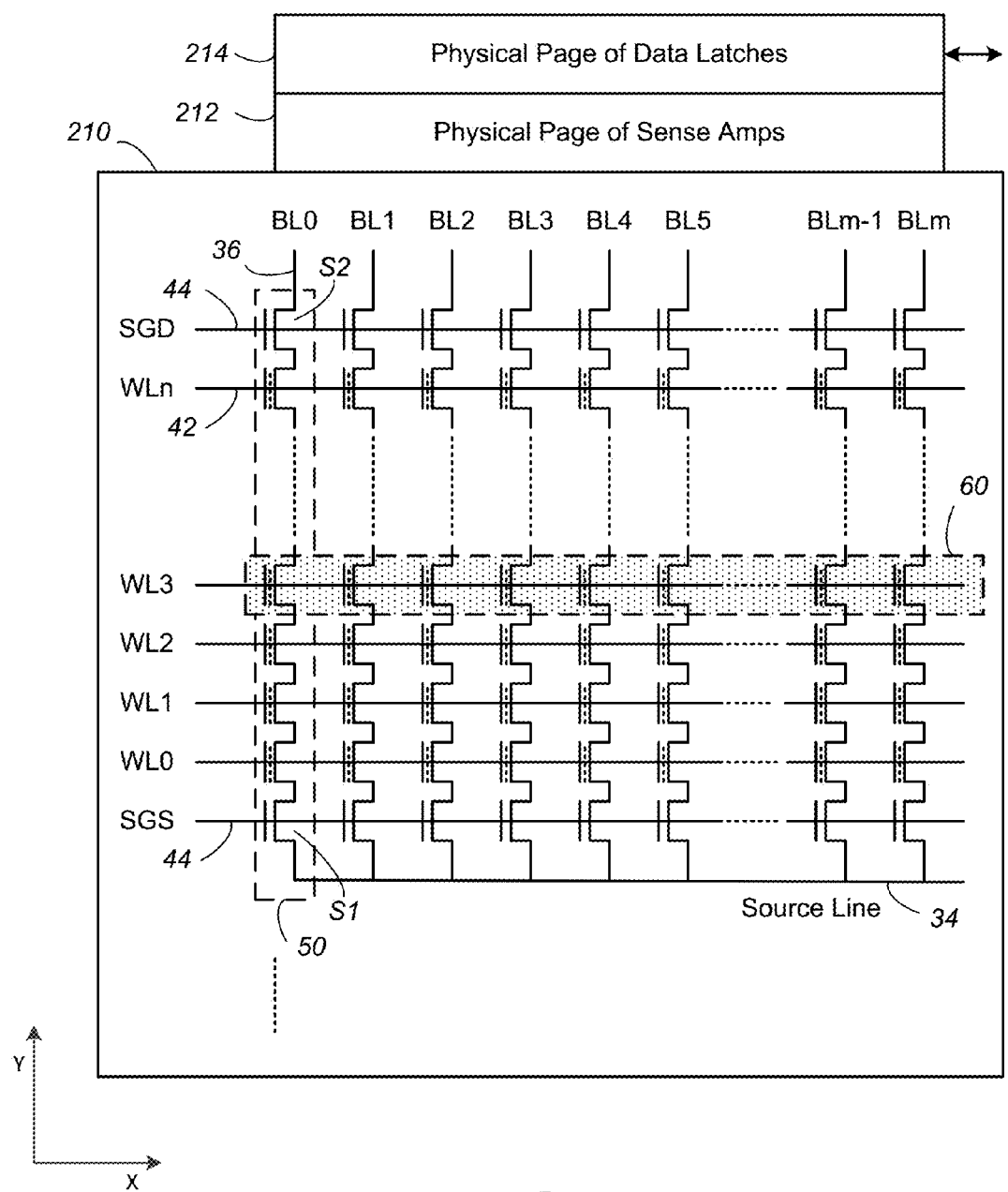
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIGS. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $N_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 7:
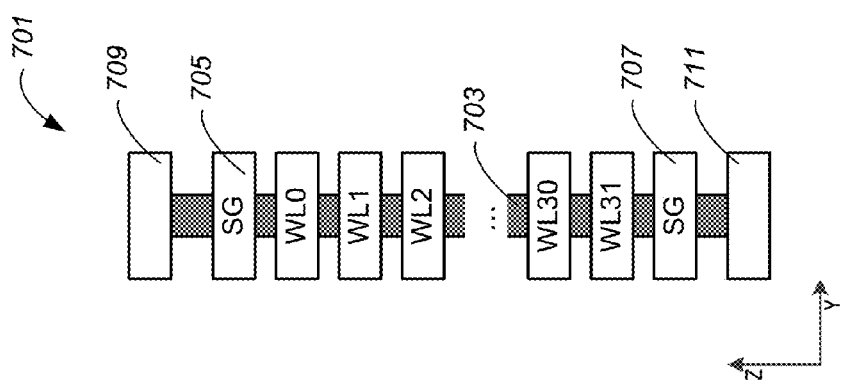
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
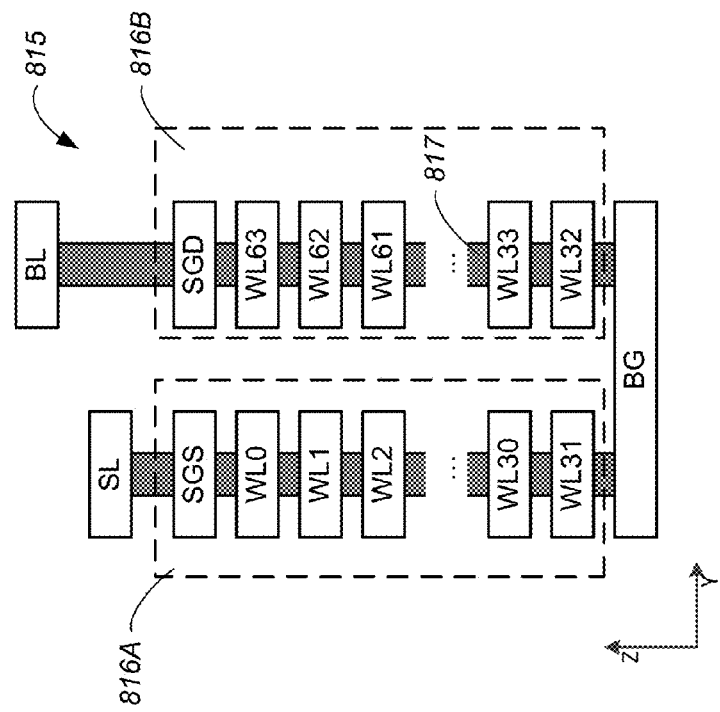
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
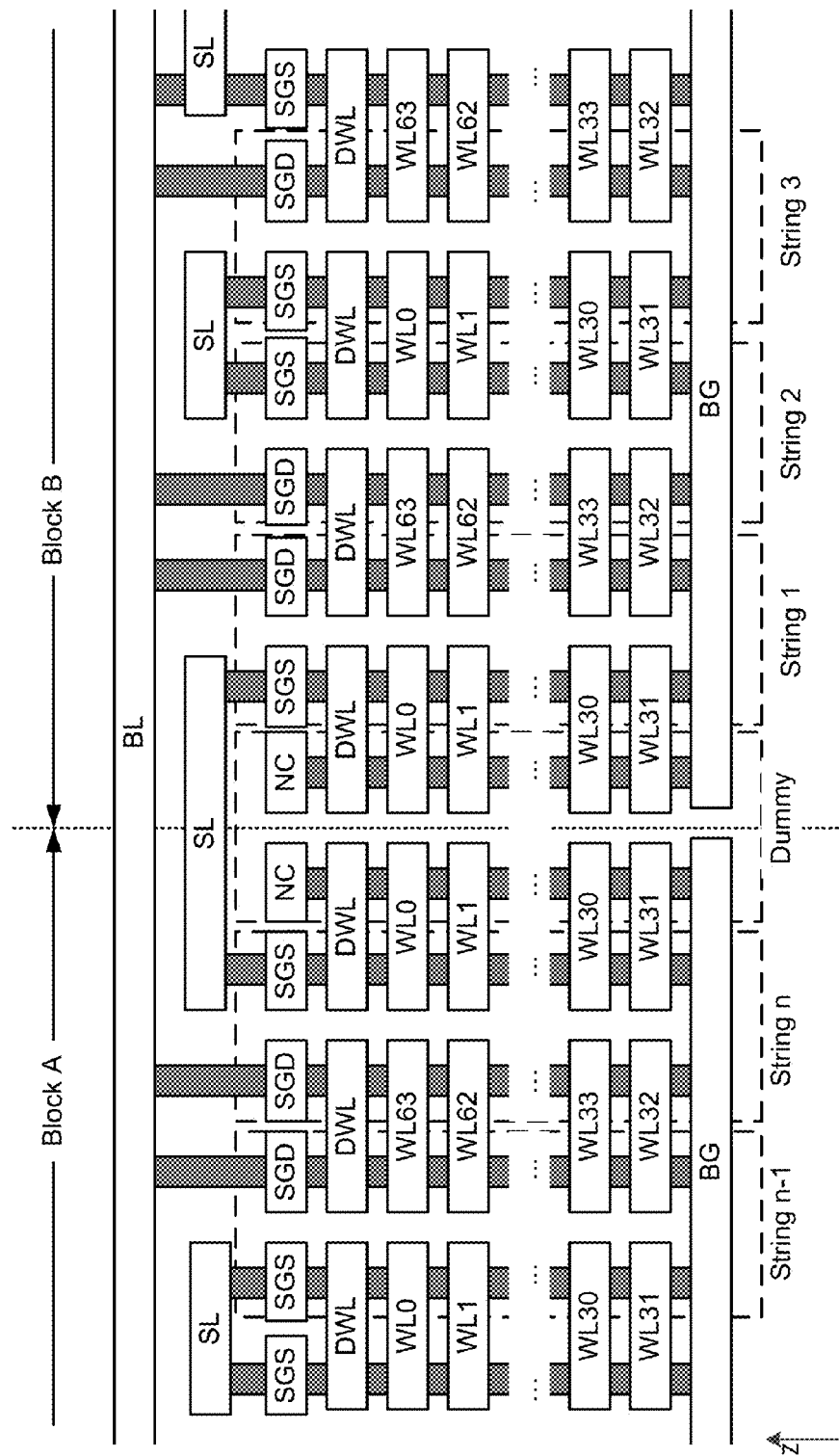
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1—String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
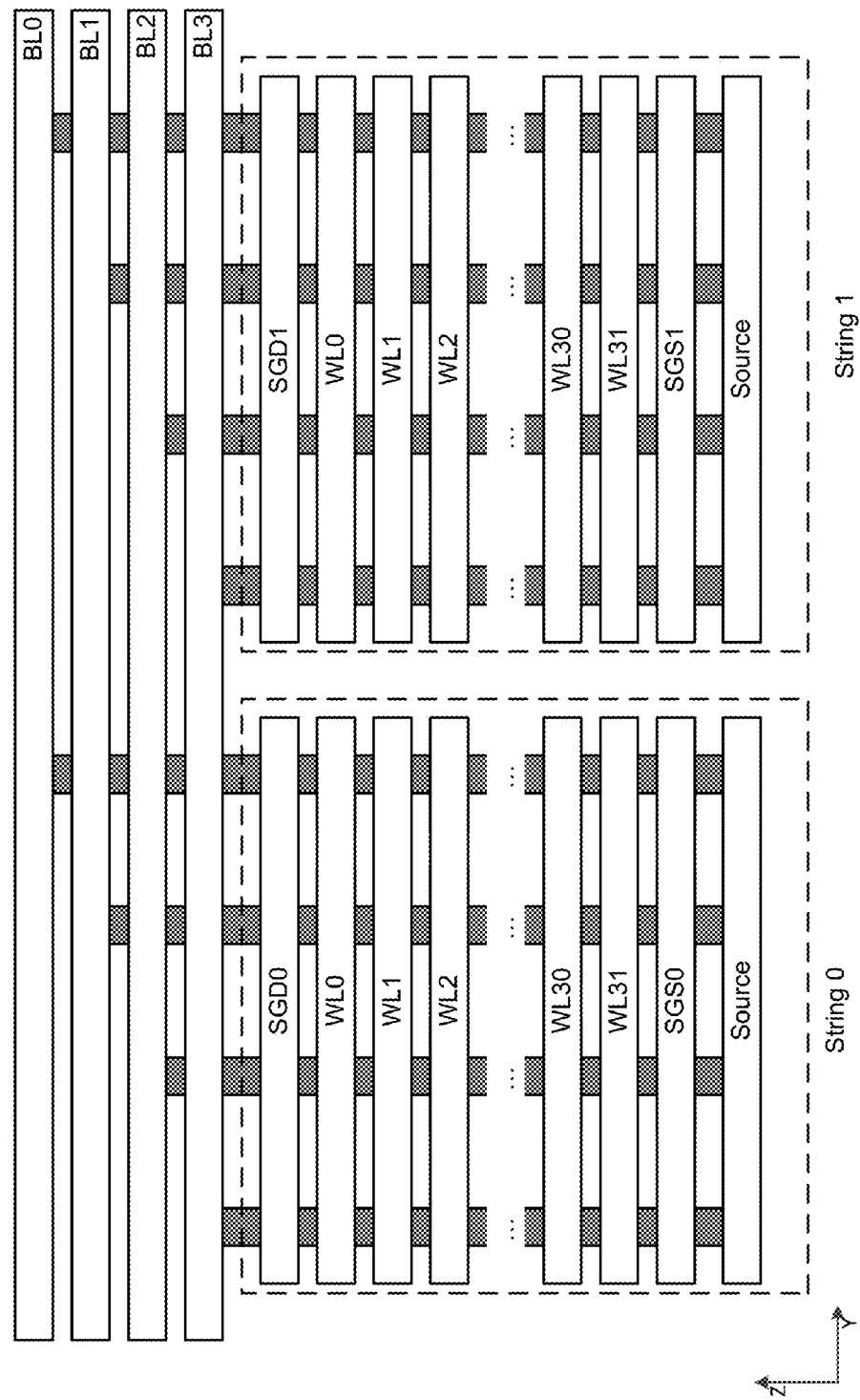
FIG. 10 shows an example of a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Memory cells, whether in 3D memories or planar memories, are generally formed on separate dies, with each die having some peripheral circuits and some interface for external communication (e.g. contact pads for bonding wires that connect with external circuits). Multiple dies may be operated together by one or more memory controller so that together they form a memory system that is capable of storing large amounts of data in an efficient manner. Communication between a memory controller and a memory die may use a dedicated communication pathway. Alternatively, multiple memory dies may share a common bus that connects the memory dies to a memory controller. In general, the memory controller manages such a bus so that dies are addressed sequentially with one die being enabled for communication at any given time.

Figure 11:
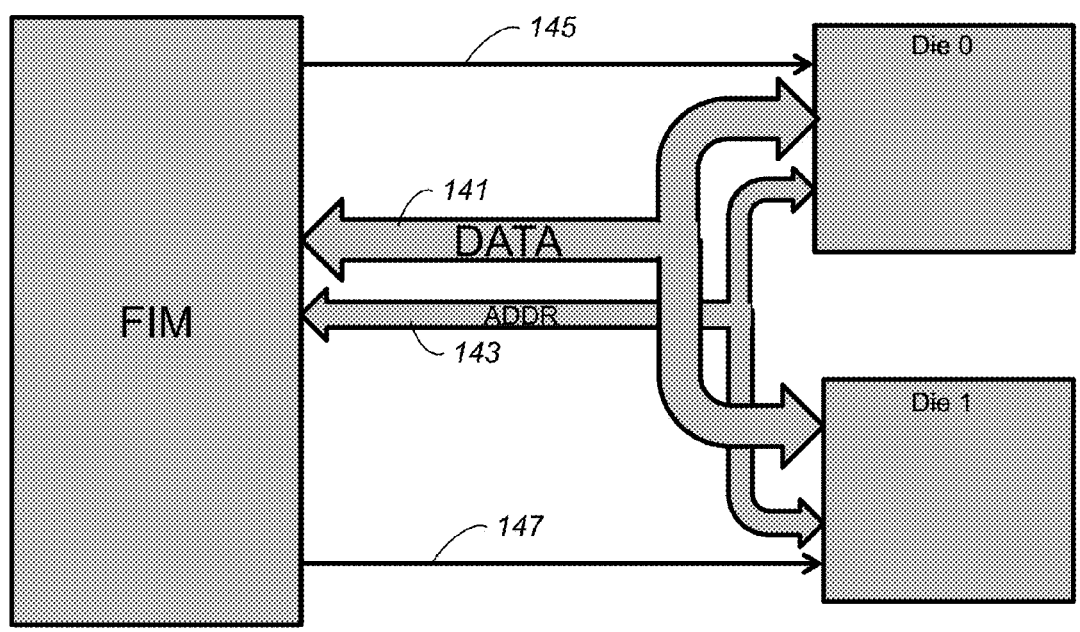
FIG. 11 illustrates an arrangement with two memory dies connected to a memory controller by a shared bus.

FIG. 11 shows an example of a memory controller, or Flash Interface Module ("FIM") that is in communication with two dies, die 0 and die 1 over a shared data bus 141. A shared address bus 143 also extends from the FIM to die 0 and die 1 to allow the controller to send address information regarding physical addresses where data is to be stored. A dedicated Chip Enable (CE) line 145 extends from the FIM to die 0 and a separate dedicated CE line 147 extends from the FIM to die 1. This allows one die to be enabled, or selected, at a time so that the data and/or address bus may be used for communication with the enabled die. In other arrangements, more than two dies may be connected to the same bus and a FIM may manage multiple busses.

Various problems may occur when data is stored in a memory and later read out. Small numbers of errors may be corrected by Error Correction Code (ECC) or some other system of redundancy. Large numbers of errors may not be easily correctable and may cause data to be unrecoverable. Some memory systems may have large numbers of errors in data when the memory system is new, e.g. because of one or more physical defects during manufacturing. In other memory systems, the number of errors increases over time and becomes large after some period of use. In either case, it is desirable to avoid large numbers of errors.

Some errors may result from programming. In some cases, a programming failure occurs when data fails to program after a certain time, or after a number of program-verify cycles (after a maximum loop count is reached). This may require programming the data elsewhere in the memory which may take significant time. Even where a programming failure does not occur, a large number of bad bits may be present from programming of data (i.e. hard errors may be present in stored data so that the bits are flipped and produce bad bits). In other cases, bits are programmed so that they are initially read correctly but are close to being misread (e.g. threshold voltage is close to a discrimination voltage used to read memory cell state). These may produce soft errors, which may become hard errors over time.

In an example presented here, a portion of data is programmed in two different locations in parallel so that at least one copy may be expected to be good after programming (e.g. one copy may not suffer a program fail, or have significant numbers of hard or soft errors). While such a scheme doubles the amount of space initially occupied when storing a portion of data, one of the copies may be discarded after it is determined that there is at least one good copy. By programming the two copies in parallel in an efficient manner, the two copies may be written without significantly increasing write time.

Figure 12A:
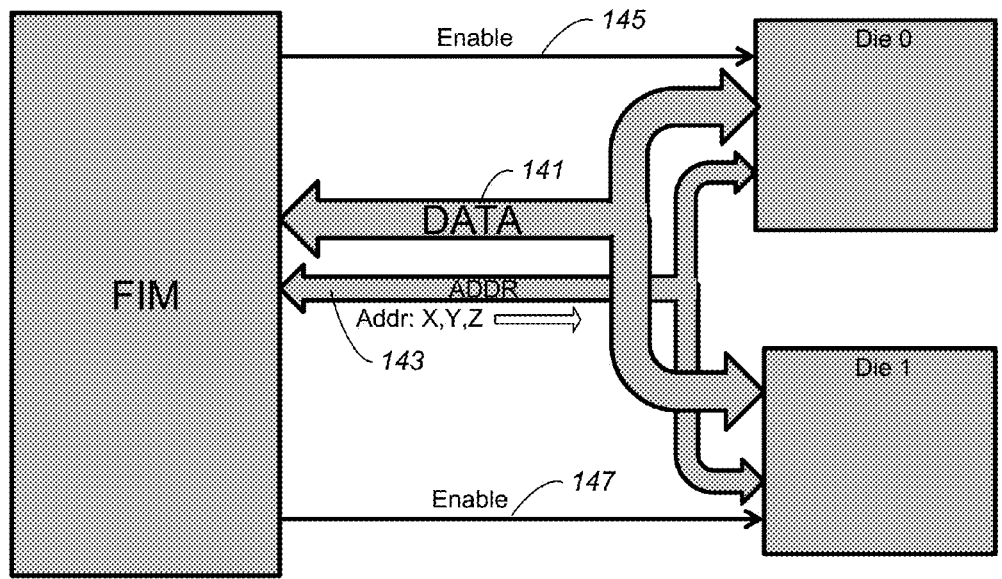
FIGS. 12A-B illustrate storing data at corresponding physical addresses in two dies.

FIG. 12A shows an example of a first step in writing two identical copies of a portion of data to two memory dies, die 0 and die 1. FIG. 12A shows both die 0 and die 1 being enabled by enable signals (select signals) on both CE lines 145, 147. Address information "X,Y,Z" is sent over address bus 143 while both die 0 and die 1 are enabled. Thus, die 0 and die 1 both receive the same address information at the same time. This address information may be latched in both die 0 and die 1 to allow writing of subsequent data at the addresses X,Y,Z in die 0 and die 1.

Figure 12B:
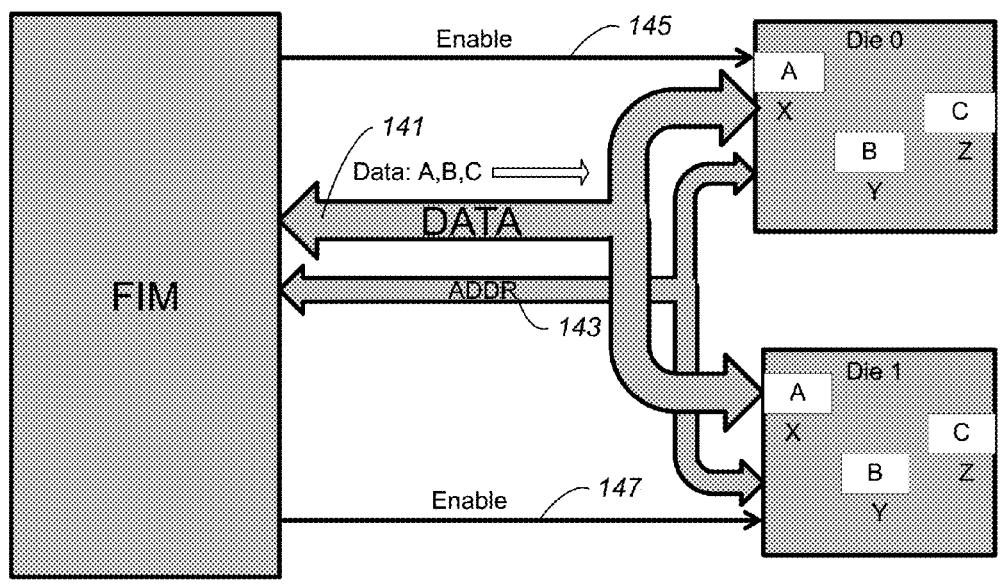

Subsequently, as shown in FIG. 12B, die 0 and die 1 are both enabled while data "A,B,C" is sent over data bus 147 to both dies. Thus, both die 0 and die 1 receive data A,B,C at the same time. Data A,B,C is then programmed in die 0 and die 1 in parallel at locations X,Y,Z in each die. The result is that both dies contain the same data at corresponding locations. It will be understood that the locations may be blocks, pages, or other unit and that dies may be identical so that for every block, page, etc. in die 0 there is a corresponding block, page, etc. in die 1. It can be seen that the time required for writing two copies of data A,B,C in this example may be equal to the time to write one copy. Thus, the second copy is written without time penalty.

Figure 13A:
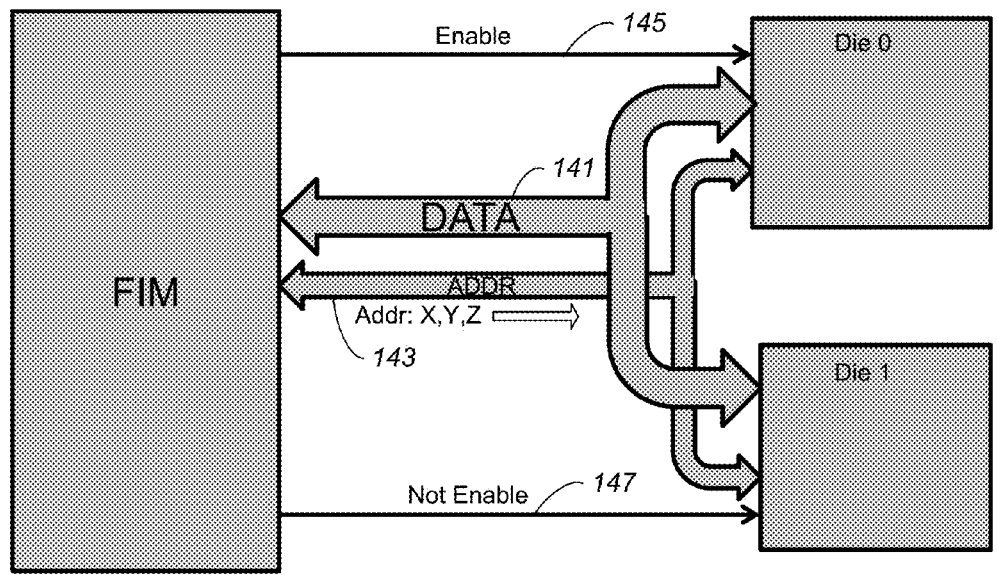
FIGS. 13A-C illustrates storing data at different physical addresses in two dies.
Figure 13B:
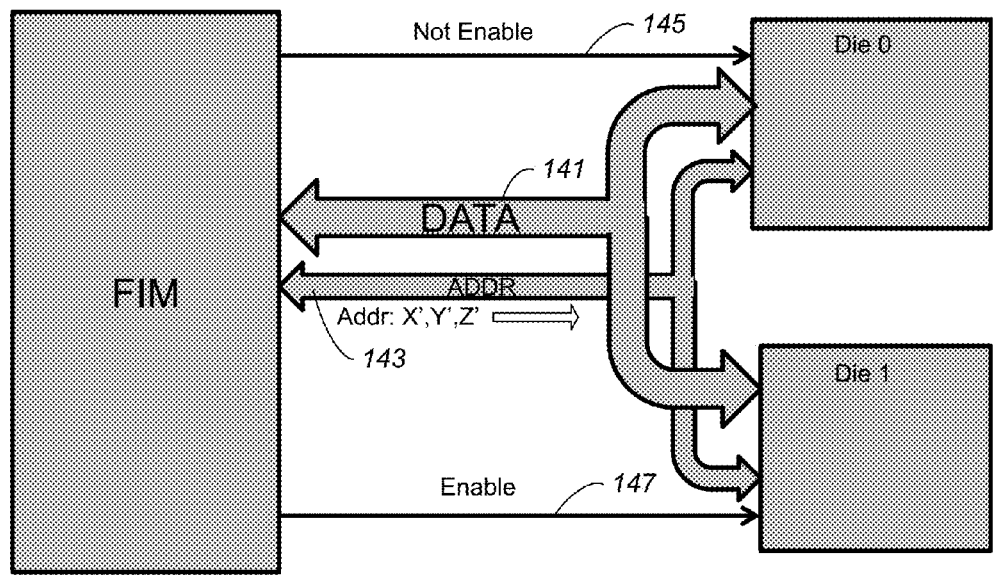
Figure 13C:
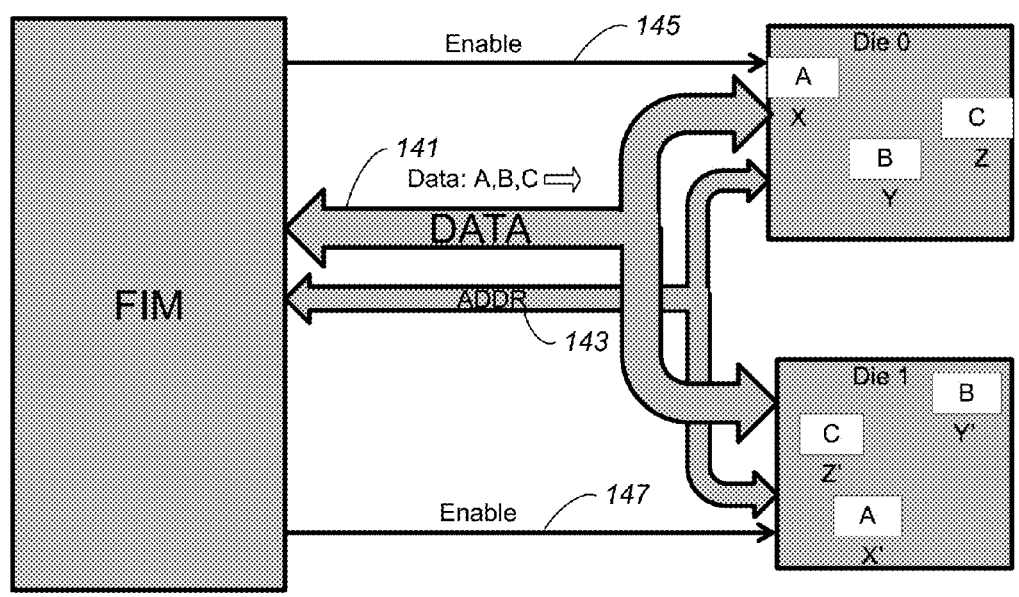

In some cases, it may not be desirable or may not be possible to write copies at identical locations in two dies. For example, bad blocks may be present in a die so that data cannot be written to such bad blocks when writing to a corresponding good block (good block with corresponding physical address) in another die. One die may contain some data that is not contained in the other die (i.e. not all data may be written in parallel to both) so that remaining free areas of two such dies may be different. FIGS. 13A-C show an efficient scheme for writing copies to two dies with different addresses.

FIG. 13A shows die 0 receiving an Enable signal on CE line 145 while die 1 does not receive an Enable signal on CE line 147. Address information X,Y,Z is sent over the address bus 143 and is received by die 0 (not by die 1).

Subsequently, as shown in FIG. 13B, die 1 receives an Enable signal on CE line 147 while die 0 does not receive an Enable signal on CE line 145. Address information X', Y', Z' is sent over address bus 143 and is received by die 1 (not die 0). Address information X', Y',Z' is different to address information X,Y,Z so that each die is configured with different address information at this point.

FIG. 13C shows data A,B,C being sent over data bus 141 while Enable signals are sent over CE lines 145, 147 to both die 0 and die 1. Thus, both dies receive identical data in parallel. This data is then programmed in each die at the physical addresses previously received by the respective dies. Thus, die 0 stores data A,B,C at locations X,Y,Z while die 1 stores data A,B,C at locations X',Y',Z'. This results in a different arrangement of data in each die. Writing two copies according to this scheme may take somewhat longer than writing a single copy because address information is sent two times in series to die 0 and die 1. However, the time required for transferring such address information is generally a small part of overall programming time (i.e. less time than data transfer or data programming) so that this may not represent a significant increase in overall write time.

Figure 14:
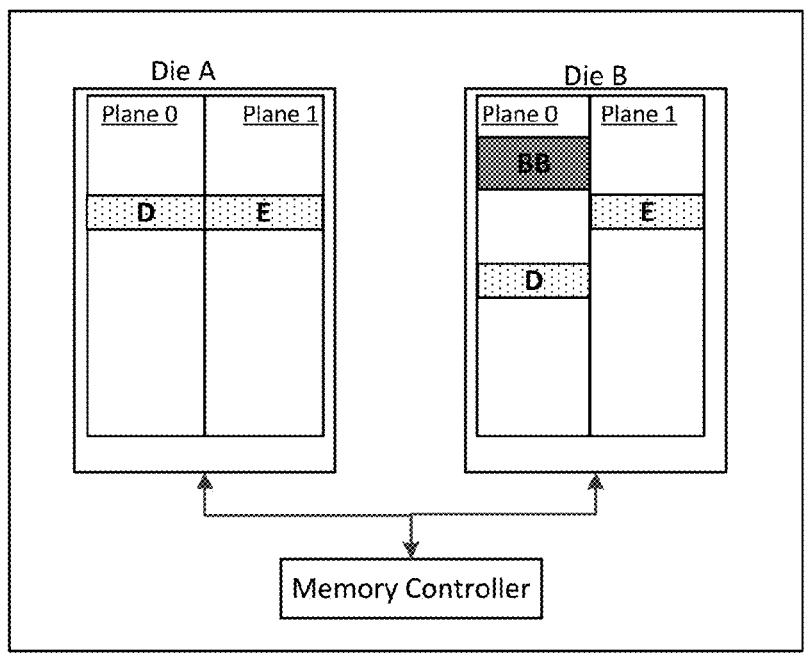
FIG. 14 illustrates an example of multi-plane dies with bad blocks.

Various memory systems may benefit from techniques described here including systems using multi-plane dies. FIG. 14 shows an example of two dies, Die A and Die B, each of which has two planes, plane 0 and plane 1. Plane 0 of Die B shows a Bad Block ("BB") area that may contain one or more bad blocks. As a result, writing skips the bad blocks and proceeds to the next good block in this plane. The result is that data is written differently in Die A and Die B (different addresses may be sent by the memory controller to allow this). While data in plane 1 (data E) is written identically in Die A and Die B, data in plane 0 (data D) is offset because of the bad block area in Die B.

More than two dies may be connected to the same bus. While identical copies of data may be written to any number of dies, it may be sufficient to write two copies. Thus, in a system with four or more memory dies, it may be desirable to pair dies and write copies to a pair of dies in parallel.

Figure 15:
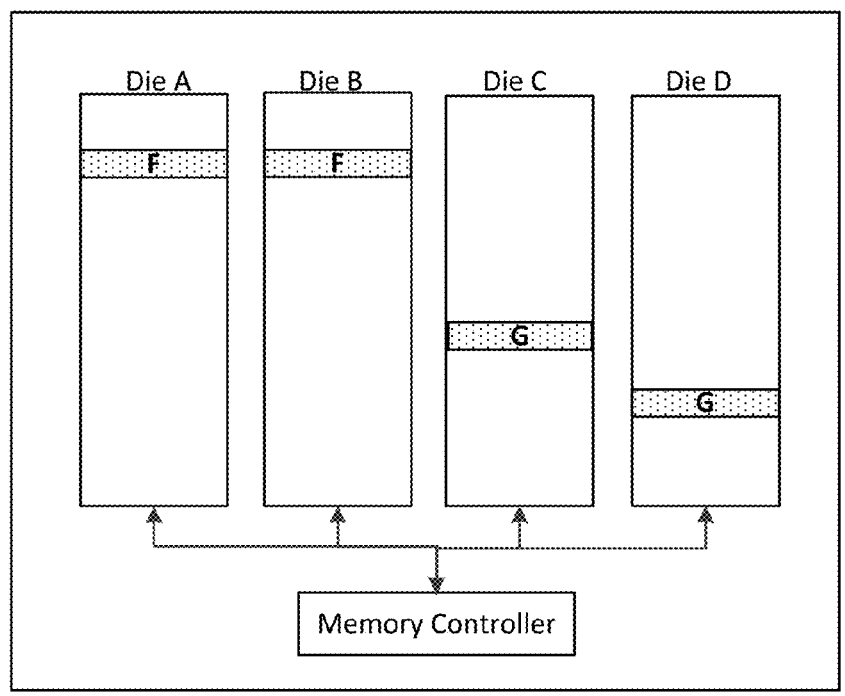
FIG. 15 illustrates an example of paired dies.

FIG. 15 shows an example of four dies connected to a memory controller. Dies A and B are paired and both store the same data (data F) at corresponding locations. Dies C and D are paired and store the same data (data G) at different locations (e.g. because of bad blocks, or previously written data in one die that is not in the other die).

While all dies are paired in the example shown, in other examples, some dies may remain unpaired and may store unique copies of data. For example, in a memory system with multiple dies, some dies may be identified as being likely to have programming-related errors while other dies may be identified as unlikely to have such errors. Dies that are likely to have such errors may be subject to a dual write scheme whereby data written in such dies is written to two dies at once. Dies that are unlikely to have such errors may be operated in a conventional manner so that they are individually enabled for transfer of data and programming. Thus, such dies may contain unique copies of data. A memory system may operate some dies using a dual write scheme and operate other dies using a conventional scheme at the same time. A block may change from conventional operation to dual write operation so that operating mode may be changeable in response to increasing errors or other factors.

A memory system may be configured for dual write from initialization, e.g. by design, or as a result of testing that indicates a high risk of program errors. In other cases, dual write is applied as needed during the life of the memory. Initially, there may be little or no need for dual writes. As the memory is used, and suffers wear-related damage, dies may be identified for dual writes and may be paired and operated accordingly. Thus, the number of dies operated in dual write mode may increase over the life of the product. A determination to operate a die in dual write mode may be based on wear (e.g. write-erase cycle count) error rate (e.g. Bit Error Rate "BER" found by ECC or otherwise) or some other metric.

Figure 16:
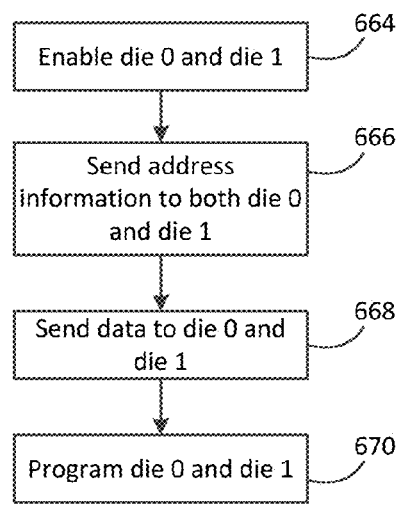
FIG. 16 illustrates steps in storing data at corresponding physical addresses in two dies.

FIG. 16 illustrates a dual write scheme that uses identical addressing in two dies. Both dies, die 0 and die 1, are enabled 664. Then, the same address information is sent to both die 0 and die 1 in parallel 666 while both dies are enabled. Subsequently, with both dies still enabled, data is sent to die 0 and die 1 668. Die 0 and die 1 are then programmed in parallel 670.

Figure 17:
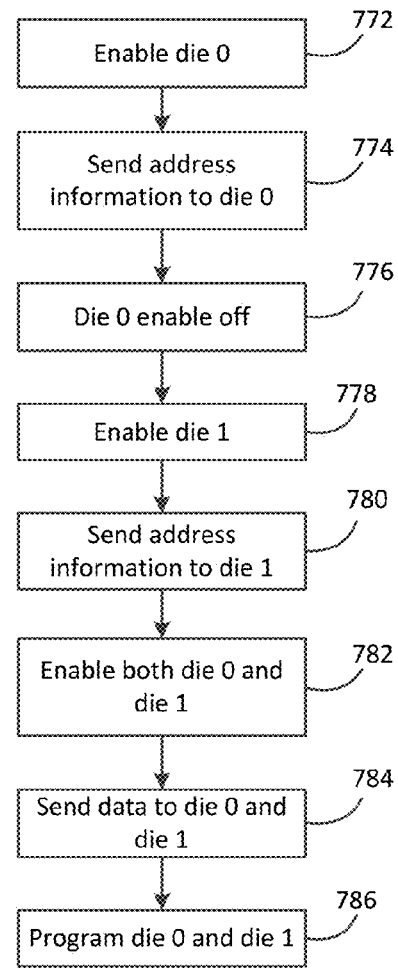
FIG. 17 illustrates steps in storing data at different physical addresses in two dies.

FIG. 17 illustrates another dual write scheme that uses different addressing for two dies. Die 0 is enabled 762 and address information is sent to die 0 774. The enable signal to die 0 is then turned off 776 and an enable signal is sent to die 1 778. Address information is then sent to die 1 780. This address information is different to the address information sent to die 0. Both die 0 and die 1 then receive an enable signal in parallel 782. Data is then sent to die 0 and die 1 in parallel 784. Die 0 and die 1 are then programmed in parallel 786. Identical addressing and different addressing may be used in the same memory system at the same time in some cases. In general, identical addressing is faster and simpler and therefore may be more desirable. A pair of dies that are operated in dual write mode may use identical addressing as a default scheme and use different addressing as needed when identical addressing cannot be maintained (e.g. when bad blocks are encountered). Thus, a pair of blocks may be partially written using identical addressing and may subsequently be further written using different addressing.

In some cases, it may be desirable to maintain two identical copies for an extended period of time to provide redundancy in case one copy becomes damaged, e.g. because of data retention problems or data disturbance. In other cases, it may be desirable to maintain just one copy after a determination is made that at least one good copy is written.

Where one copy is successfully written in one die and a program fail occurs during writing of the other copy in another die then the program fail may be ignored and the successfully written copy may be maintained. If a program fail occurs in both dies then the data may be rewritten either in the same dies or elsewhere. When both copies are written without a program fail then some determination may be made as to which copy should be maintained and which should be discarded. For example, the number of program-verify cycles (loop count) needed to program the data in each die may be compared. Higher loop count may be an indicator of programming problems so that the copy of the data that has a higher loop count may be discarded and the copy with the lower loop count may be maintained. In another example, data may be read from each die and to and a copy which produces one or more read errors may be discarded. The number of read steps (read loop count) may also be compared and the copy with a higher read loop count may be discarded. A numbers of errors may be compared. For example, some data may be read out and subject to ECC decoding to determine a BER for each copy (at least from some sample of each copy). A copy with a higher error rate may be discarded.

In some cases, a copy to be discarded may be marked as obsolete and may be erased at any time after that. In other cases, a copy to be discarded may be maintained for some period of time as a redundant copy and then discarded. For example, in some memory systems data is initially written in a low-density format (e.g. one bit per cell, SLC format) and is later folded into a higher-density format (e.g. two, three, or more bits per cell, MLC format). A redundant copy may be maintained until data is folded and the MLC copy is confirmed as successfully written.

Figure 18:
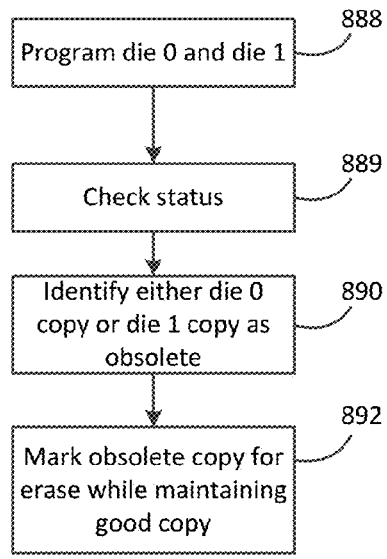
FIG. 18 illustrates an example of dual write and subsequent operation.

FIG. 18 shows an example where die 0 and die 1 are programmed with identical data 888. Then, some analysis is performed to identify either the die 0 copy or the die 1 copy as an obsolete copy 890. This may be based on some quality metric, such as, program fail, program loop count, read fail, read loop count, bit error rate, or other metric or combination of metrics. Subsequently, the obsolete copy is marked for erase while the good copy is maintained 892. Subsequently, any requests for the data (e.g. host read command) are directed to the good (not obsolete) copy.

CONCLUSION

The foregoing detailed description has been presented for purposes of illustration and description. It is not intended to be exhaustive or to limit the attached claims. Many modifications and variations are possible in light of the above teaching.

It is claimed:

1. A method comprising:
enabling a first nonvolatile memory chip and disabling a second nonvolatile memory chip, wherein the first nonvolatile memory chip and the second nonvolatile memory chip are connected to a memory controller via a memory bus;
sending first address information to the first nonvolatile memory chip while the second nonvolatile memory chip is disabled;
disabling the first nonvolatile memory chip and enabling the second nonvolatile memory chip;
sending second address information to the second nonvolatile memory chip while the first nonvolatile memory chip is disabled;
enabling the first nonvolatile memory chip and the second nonvolatile memory chip;
while the first nonvolatile memory chip and the second nonvolatile memory chip are both enabled and the first address information is sent to the first nonvolatile memory chip and the second address information is sent to the second nonvolatile memory chip, sending user data over the memory bus to the first nonvolatile memory chip and to the second nonvolatile memory chip in parallel; and
programming the user data in the first nonvolatile memory chip and the second nonvolatile memory chip in parallel.

2. The method of claim 1 wherein
the second address information is different than the first address information.

3. The method of claim 1 wherein the first address information comprises address information of good blocks in the first nonvolatile memory chip, the second address information comprises address information of good blocks in the second nonvolatile memory chip, the good blocks in the first nonvolatile memory chip and the good blocks in the second nonvolatile memory chip being at different physical locations.

4. The method of claim 1 further comprising
enabling a third nonvolatile memory chip and enabling a fourth nonvolatile memory chip at the same time;
while the third nonvolatile memory chip and the fourth nonvolatile memory chip remain enabled, sending third address information to the third nonvolatile memory chip and the fourth nonvolatile memory chip in parallel over the memory bus; and
while the third nonvolatile memory chip and the fourth nonvolatile memory chip are enabled, sending the user data to the third nonvolatile memory chip and the fourth nonvolatile memory chip in parallel over the memory bus.

5. The method of claim 1 further comprising:
identifying a copy of the user data in either the first nonvolatile memory chip or the second nonvolatile memory chip to be discarded based upon a metric; and
erasing the copy of the user data identified to be discarded while maintaining the user data in the other of the first or the second nonvolatile memory chips.

6. The method of claim 5 wherein the metric used for identifying the copy of the user data to be discarded comprises at least one of: write time, write loop count, program fail, program loop count, read fail, read loop count, bit error rate, and/or write errors when programming the user data in the first nonvolatile memory chip and the second nonvolatile memory chip in parallel.

7. The method of claim 1 further comprising:
subsequently determining the status of programming in the first nonvolatile memory chip and the second nonvolatile memory chip.

8. The method of claim 7 wherein, if the status of programming in the first nonvolatile memory chip is a failed status, then marking a copy of the user data in the first nonvolatile memory chip as bad and subsequently directing read requests for the user data to the copy of the user data in the second nonvolatile memory chip.

9. The method of claim 1 wherein the user data stored in the first nonvolatile memory chip is also stored in the second nonvolatile memory chip.

10. A multi-chip nonvolatile memory system comprising:
a first nonvolatile memory chip;
a second nonvolatile memory chip;
a data bus that transfers data to and from the first nonvolatile memory chip and the second nonvolatile memory chip;
an address bus that transfers address information to the first nonvolatile memory chip and the second nonvolatile memory chip; and
a memory controller connected to the first nonvolatile memory chip and the second nonvolatile memory chip via the data bus and the address bus, wherein the memory controller is configured to operate in a dual write mode comprising identical addressing and different addressing, and wherein in the different addressing, the memory controller is configured to:
enable the first nonvolatile memory chip and disable the second nonvolatile memory chip;
send first address information to the first nonvolatile memory chip over the address bus while the second nonvolatile memory chip is disabled;
disable the first nonvolatile memory chip and enable the second nonvolatile memory chip;
send second address information to the second nonvolatile memory chip over the address bus while the first nonvolatile memory chip is disabled;
enable the first nonvolatile memory chip and the second nonvolatile memory chip; and
send user data over the data bus to be stored in the first nonvolatile memory chip and the second nonvolatile memory chip in parallel while the first nonvolatile memory chip and the second nonvolatile memory chip are both enabled and the first address information is sent to the first nonvolatile memory chip and the second address information is sent to the second nonvolatile memory chip.

11. The multi-chip nonvolatile memory system of claim 10, wherein the first nonvolatile memory chip is enabled and disabled by respectively enabling and disabling a first chip select line extending from the memory controller to the first nonvolatile memory chip, wherein the second nonvolatile memory chip is enabled and disabled by respectively enabling and disabling a second chip select line extending from the memory controller to the second nonvolatile memory chip, and wherein the first address information is different from the second address information.

12. The multi-chip nonvolatile memory system of claim 10 wherein the first nonvolatile memory chip contains first bad blocks, the second nonvolatile memory chip contains second bad blocks, the memory controller maintains maps of the first bad blocks and the second bad blocks, and wherein the first address information is directed only to blocks of the first nonvolatile memory chip that are not on the map of the first bad blocks and the second address information is directed only to blocks of the second nonvolatile memory chip that are not on the map of the second bad blocks.

13. The multi-chip nonvolatile memory system of claim 10, wherein in the identical addressing, the memory controller is configured to:
enable the first nonvolatile memory chip and the second nonvolatile memory chip at the same time;
send a third address information to the first nonvolatile memory chip and the second nonvolatile memory chip over the address bus in parallel while the first nonvolatile memory chip and the second nonvolatile memory chip are enabled; and
send the user data to the first nonvolatile memory chip and the second nonvolatile memory chip in parallel over the data bus while the first nonvolatile memory chip and the second nonvolatile memory chip are enabled.

14. The multi-chip nonvolatile memory system of claim 10 wherein the memory controller is configured to apply the identical addressing to the first nonvolatile memory chip and the second nonvolatile memory chip by default, and further configured to switch to the different addressing when the identical addressing cannot be maintained.

15. The multi-chip nonvolatile memory system of claim 10 wherein the memory controller is configured to, in the dual write mode, perform a status check on the first nonvolatile memory chip and the second nonvolatile memory chip after sending the user data over the data bus.

16. The multi-chip nonvolatile memory system of claim 15 wherein the memory controller is further configured to maintain a record of programming failures and to direct any subsequent read requests to a copy of written data that did not produce a programming failure.

17. The multi-chip nonvolatile memory system of claim 10 wherein the memory controller is configured to, in a single-die write mode, select one die at any time.

18. A method comprising:
storing user data, by a memory controller, in a first nonvolatile memory chip and a second nonvolatile memory chip using an identical addressing in which the user data is stored at same physical locations in the first nonvolatile memory chip and the second nonvolatile memory chip, wherein the first nonvolatile memory chip and the second nonvolatile memory chip are connected to the memory controller via a shared bus;
identifying, by the memory controller, a condition in which the user data cannot be stored at the same physical locations in the first nonvolatile memory chip and the second nonvolatile memory chip;
in response to identifying the condition, switching, by the memory controller, to a different addressing in which the user data is stored at a first physical location in the first nonvolatile memory chip and at a second physical location in the second nonvolatile memory chip, wherein the first physical location and the second physical location have different addresses;
wherein the different addressing comprises:
enabling the first nonvolatile memory chip and disabling the second nonvolatile memory chip;
sending first address information to the first nonvolatile memory chip while the second nonvolatile memory chip is disabled;
disabling the first nonvolatile memory chip and enabling the second nonvolatile memory chip;

sending second address information to the second nonvolatile memory chip while the first nonvolatile memory chip is disabled;
enabling the first nonvolatile memory chip and the second nonvolatile memory chip; and
while the first nonvolatile memory chip and the second nonvolatile memory chip are both enabled, sending the user data to the first nonvolatile memory chip and to the second nonvolatile memory chip in parallel.

19. The method of claim 18 wherein the first and second nonvolatile memory chips are configured for storage of identical data in response to a determination that the first and second nonvolatile memory chips have high rates of: program failure, or read failure.

* * * * *